United States Patent [19]
Su et al.

[11] Patent Number: 5,507,874
[45] Date of Patent: Apr. 16, 1996

[54] METHOD OF CLEANING OF AN ELECTROSTATIC CHUCK IN PLASMA REACTORS

[75] Inventors: Yuh-Jia Su, Cupertino; Richard Muh, Fremont, both of Calif.

[73] Assignee: Applied Materials, Inc., Santa Clara, Calif.

[21] Appl. No.: 253,458

[22] Filed: Jun. 3, 1994

[51] Int. Cl.$^6$ .................................................. C23C 16/00
[52] U.S. Cl. ........................ 134/1; 437/949; 437/946; 118/723 R; 118/723 VE; 134/7
[58] Field of Search ...................................... 437/949, 946; 118/716, 717, 723 R, 725, 723 VE; 134/1, 4, 7

[56] References Cited

U.S. PATENT DOCUMENTS

5,166,856  11/1992  Liporace et al. .............. 422/186.05
5,191,506   3/1993  Logan et al. ..................... 361/234
5,207,437   5/1993  Barnes et al. .................... 279/128
5,298,720   3/1994  Cuomo et al. ................ 219/121.43
5,382,311   1/1995  Ishikawa et al. ................ 118/723 E Primary Examiner—R. Bruce Breneman
Assistant Examiner—Ramamohan Rao Paladugu
Attorney, Agent, or Firm—Robert W. Mulcahy

[57] ABSTRACT

The present invention provides a method for removing particulate contaminants from an electrostatic chuck pedestal for a semiconductor workpiece by physical removal employing a soft material workpiece or by creating a plasma sheath which suspends the contaminants from the chuck surface and entrains them in the gas stream of the chamber vacuum exhaust system of the chamber. The contaminant removal processes are particularly effective in continuous plasma processes for the treatment of workpieces.

24 Claims, 4 Drawing Sheets

METHOD OF CLEANING OF AN ELECTROSTATIC CHUCK IN PLASMA REACTORS

FIELD OF THE INVENTION

This invention relates to a method for cleaning electrostatic chucks used in semiconductor plasma reactors and, more specifically, a method of controlling particulate contamination of an electrostatic chuck during continuous plasma processing of semiconductor workpieces.

DESCRIPTION OF THE BACKGROUND ART

Plasma processing of semiconductor workpieces involves the performance of one or more plasma processes such as gas chemistry etching, gas chemistry deposition, physical sputtering, or rapid thermal annealing on one or more semiconductor workpieces/wafers within the plasma chamber. As the geometries of semiconductor devices become ever so smaller, the ability to maintain the uniformity and accuracy of critical dimensions becomes strained. Many of the processes carried out within semiconductor processing reactors leave contaminant deposits throughout the process chamber which accumulate and become the source of particulate matter harmful to the creation of a semiconductor device. As these processes become ever faster and the dimension size of the semiconductor device has become ever smaller, the presence of particulate matter upon the surface of the semiconductor workpiece has become more of a risk factor. Consequently, the cleanliness of plasma processing chambers (i.e. plasma etching, reactive ion etching (RIE), plasma enhanced chemical vapor deposition (PECVD), etc.) is critical.

Particulate contamination buildup on all the elements of the semiconductor process chamber has long been a major problem in etch processing of semiconductor elements employing metal films. These metal films are generally etched by employing a number of reactive gases, including halocarbon gases, as plasma components. In the case of an aluminum film, the etchant gases used are predominantly the chlorine containing gases, chlorine ($Cl_2$) and boron trichloride ($BCl_3$), which enables formation of volatile aluminum chloride compounds upon etching, which volatile compounds can be removed from the etch processing chamber by applied vacuum. However, simultaneously with the formation of volatile aluminum chloride compounds, other active chlorine and boron containing species are formed which can react with any oxygen and water vapor present in the etch processing chamber or with organic species from patterning photoresist to form non volatile particulate compositions which ultimately produce relatively large quantities of contaminant on the process chamber inner walls. The non volatile particulate compositions initially tend to remain inside the etch chamber in the form of loosely attached particles to the various element surfaces of the chamber. These contaminant compounds accumulate on the workpiece pedestal among other surfaces in the chamber.

Removal of contaminants from the various surfaces inside a plasma processing chamber has been accomplished by periodically cleaning the chamber including the workpiece pedestal and the gas distribution plates. Known cleaning methods have involved opening the plasma chamber, disassembling portions of the chamber, and removing the contaminant deposits by physical or chemical methods. For example, the chamber and the elements therein can be rinsed with a solution of hydrochloric acid, or hand wiped with a solvent, to dissolve various contaminants. Alternatively they may be washed with water and dried. All of these cleaning methods are complicated, disruptive, time consuming and can be the source of additional contamination. The problem of reactor contamination becomes particularly acute in single wafer plasma etch reactors where continuous processes are employed resulting in accumulated contaminant buildup.

One of the plasma process chamber elements which can suffer from deposition of non-volatile contaminants is the electrostatic chuck. Electrostatic chucks are devices which have gained wide usage in the semiconductor field for holding or clamping semiconductor wafers during plasma manufacturing processes. An electrostatic chuck secures the entire lower surface of a workpiece substrate by Coulombic force and provides an alternative to mechanical clamping of the workpiece to the support platform or pedestal. When a workpiece/substrate is secured to the platform using an electrostatic chuck, the flatness of the substrate/workpiece is improved. These chucks eliminate the need for mechanical clamping mechanisms, which are often clumsy and induce contamination into the processing chamber. Typical electrostatic chucks utilized in the prior art can be found in U.S. Pat. Nos. 4,184,188 (Briglia); 4,384,918 (Abe); 4,724,510 (Wicker et al.); 4,665,463 (Ward et al.); 5,166,856 (Liporate et al.); and 5,191,506 (Logan et al.).

An electrostatic chuck is a capacitor element comprised of a conductor/insulator coating structure to generate an electrostatic field between a workpiece wafer and the chuck to hold or clamp the wafer against the chuck. Various insulating coatings have been employed in these chucks including soft synthetic resins such as polytetrafluoroethylene, and polyimides or hard ceramics such as alumina or diamond. It has been found that the buildup of non volatile particulate contaminants on either hard or soft electrostatic chucks is detrimental to the holding capacity of the chuck because the presence of the particles prevents the secure seating of the lower surface of the wafer on the particle ridden surface of the chuck. Moreover, when a hard ceramic chuck is employed, accumulated contaminant particles thereon will become pulverized by continued wafer/workpiece processing and thereby form an electrically disruptive powdered coating on the insulating surface of the chuck. In the case of soft resin chucks, continued workpiece processing causes the accumulated particles on the insulating surface to be imbedded in the soft resin therein thereby disrupting the Coulombic forces generated by the chuck capacitor. Consequently, employment of electrostatic chucks in plasma processing requires that non volatile contaminants be removed by either periodically cleaning the plasma reactor or some means of control of contaminant buildup on the chuck during continuous plasma processing cycles so as to prevent undesirable contaminant buildup.

The present invention provides methods for cleaning electrostatic chucks used in semiconductor plasma treatment reactors and for controlling contaminant buildup on electrostatic chucks in continuous plasma process reactors for purposes of preventing faulty etching of improperly clamped workpieces and reducing the need to shut down and clean the plasma chamber. The present electrostatic chuck cleaning developments extend the periods of required cleaning of electrostatic chucks and particularly improves the efficiency of reactive ion etch processes.

SUMMARY OF THE INVENTION

The present invention is based on the discovery that particulate contaminants generated in plasma treatment reactor and deposited on a semiconductor platform, in particular, an electrostatic chuck, can be removed in a particular ongoing continuous plasma processing cycle by performing an in-situ electrical or mechanical removal of contaminant particles from the chuck surface. Plasma treatments herein include the deposition and/or dry etching of dielectric, semiconductor and conductor layers. The present invention is applicable to plasma processing chambers which perform gas chemistry etching, gas chemistry deposition, physical sputtering, and any other plasma operation on one or more wafers positioned within the chamber. The instant invention is particularly suited to the cleaning of hard surface electrostatic chucks.

It has been further found that the intermittent changes or manipulation of plasma parameters in a continuous plasma reactor process generates a resulting less intense plasma and plasma sheath which causes transfer of contaminant particle deposits on an electrostatic chuck to the plasma sheath where they are removed by the vacuum exhaust. More particularly, the creation of a plasma under low magnetic field and power conditions, reduced pressure, and increased gas flow in a plasma chamber employing an electrostatic chuck results in the formation of a plasma having a sheath which causes suspension of contaminant particulate matter from the chuck and entrainment of the particles in the gas exhaust stream of the chamber thereby providing exit of the contaminant from the chamber. The instant plasma sheath generation sub-process can be practiced without modification or the cleaning of the chuck surface may be enhanced by additional process steps. For example, it has been found that sequentially applying voltages of different polarity to the electrostatic chuck during the plasma sheath cleaning interval enhances removal of the contaminant particles formed on the chuck surface. And a further additional embodiment includes the sub-process of (i) introducing a soft material workpiece element to the electrostatic chuck workpiece pedestal, (ii) applying a chucking voltage to the pedestal whereby contaminant particles (especially those of greater than 3 microns) embed in the soft material workpiece and (iii) removal of the contaminant embedded soft workpiece.

The present invention is directed to a method for cleaning an electrostatic chuck having a surface for retaining a substrate at a processing station within a plasma processing chamber provided with a vacuum exhaust capability and adapted for continuously processing substrates within a controlled subatmospheric environment, comprising:
  a) retaining a substrate at the substrate retaining surface of the electrostatic chuck within a plasma processing chamber;
  b) communicating into the chamber at least one selected gas;
  c) applying electrical energy to the chamber to establish a gas plasma and an associated electric field substantially perpendicular to the substrate-retaining surface of the electrostatic chuck so as to perform a plasma process on the substrate;
  d) removing the processed workpiece from the electrostatic chuck surface upon completion of the plasma processing; and
  e) performing an in-situ electrical or mechanical removal of contaminant particles from the electrostatic chuck surface in the closed chamber prior to introduction of the next substrate to be plasma processed, while maintaining the chamber under a controlled subatmospheric environment.

The instant invention is further directed to a method for continuously conducting plasma treatment of semiconductor substrates in a closed vacuum chamber, comprising:
  a) providing a plasma chamber including a vacuum exhaust system and a substrate pedestal having an electrostatic chuck clamp adapted to retain a substrate on the surface of the chuck;
  b) communicating into the chamber one or more selected plasma generating gases;
  c) applying electrical energy to the chamber to establish a treatment plasma and an associated electric field substantially perpendicular to the pedestal surface for receiving the substrate so as to perform a treatment of said substrate;
  d) removing the processed substrate from the electrostatic chuck surface upon completion of the plasma treatment; and
  e) creating a plasma above the electrostatic chuck pedestal surface of density reduced compared to said treatment plasma when the electrostatic chuck surface is exposed, whereby particulate contaminant residues formed on said pedestal are suspended in the plasma sheath and entrained in the gas removal stream of the chamber causing the particles to be drawn from the chamber through the vacuum exhaust system.

A further embodiment of this plasma sheath cleaning method further comprises the step of:
  sequentially applying voltages of different polarity to the electrostatic chuck during the plasma sheath cleaning step to enhance suspension of the contaminant particles from the electrostatic chuck surface and transfer same to the plasma sheath.

The present invention is still further directed to a method of removing contaminant particles from a hard surface electrostatic chuck by:
  a) providing a plasma chamber comprised of an electrostatic chuck pedestal;
  b) placing a workpiece comprised of a soft resin material surface onto the electrostatic chuck surface in a manner whereby the soft resin material is in contact with the hard chuck surface;
  c) applying a direct current chucking voltage to the chuck to cause the soft resin material of the workpiece to be drawn and pressed to the surface of the chuck whereby relatively large contaminant particles are embedded in the soft resin material; and
  d) removing of the contaminant containing workpiece from the chamber.

DETAILED DESCRIPTION OF THE INVENTION

The invention herein provides a means of removing residual contaminant particles from electrostatic chucks used to secure substrates, such as semiconductor wafers to pedestals or platforms at work stations within plasma processing chambers. The invention is particularly useful in controlling the deposition of contaminants on electrostatic chucks generated in plasma etch processes. Examples of the instant process are described in the following preferred embodiments in terms of etch processing of substrates and the entrainment and removal of contaminants such as organo metallic residues comprising aluminum and compounds thereof. However, the concept of contaminant removal from electrostatic chucks as set forth herein is applicable to plasma process chambers in general. For example, pedestal contaminant control is important for chambers used for chemical vapor deposition, physical vapor deposition, epitaxial growth, and dopant implantation as well as chambers used in metal etching.

As an illustration of plasma processes benefitting from the present contaminant invention, typical plasma assisted aluminum etch chemistry utilizes process gases including $BCl_3$, $Cl_2$, and $N_2$ as an example. During a chlorine-based aluminum etch process, aluminum on the substrate reacts with chlorine atoms and possibly with chlorine containing molecules to form volatile aluminum chloride molecular species. Some of this etch byproduct is pumped out of the chamber, while some reacts with or associates with organic species from patterning photoresists or with other reactive species in the process chamber to form non-volatile particulate materials, many of which are loosely deposited as potential contaminants on the process chamber elements including the substrate or semiconductor wafer support pedestal and chamber wall surfaces. The present invention is directed to the removal or control of such contaminants from pedestal surfaces, especially those defining electrostatic chucks.

Figure 1:
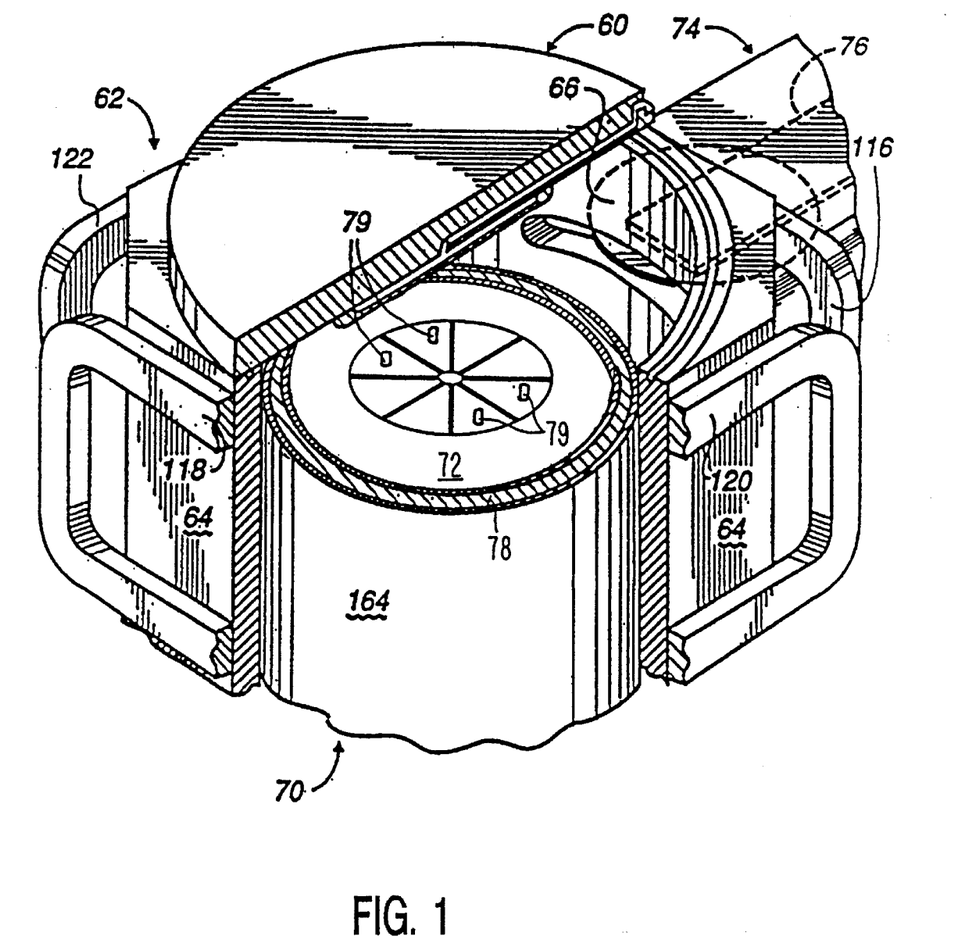
FIG. 1 is a vertical cross section of a substrate support pedestal and auxiliary apparatus used in semiconductor etch processing and employing the contaminant control process of the present invention.
Figure 2:
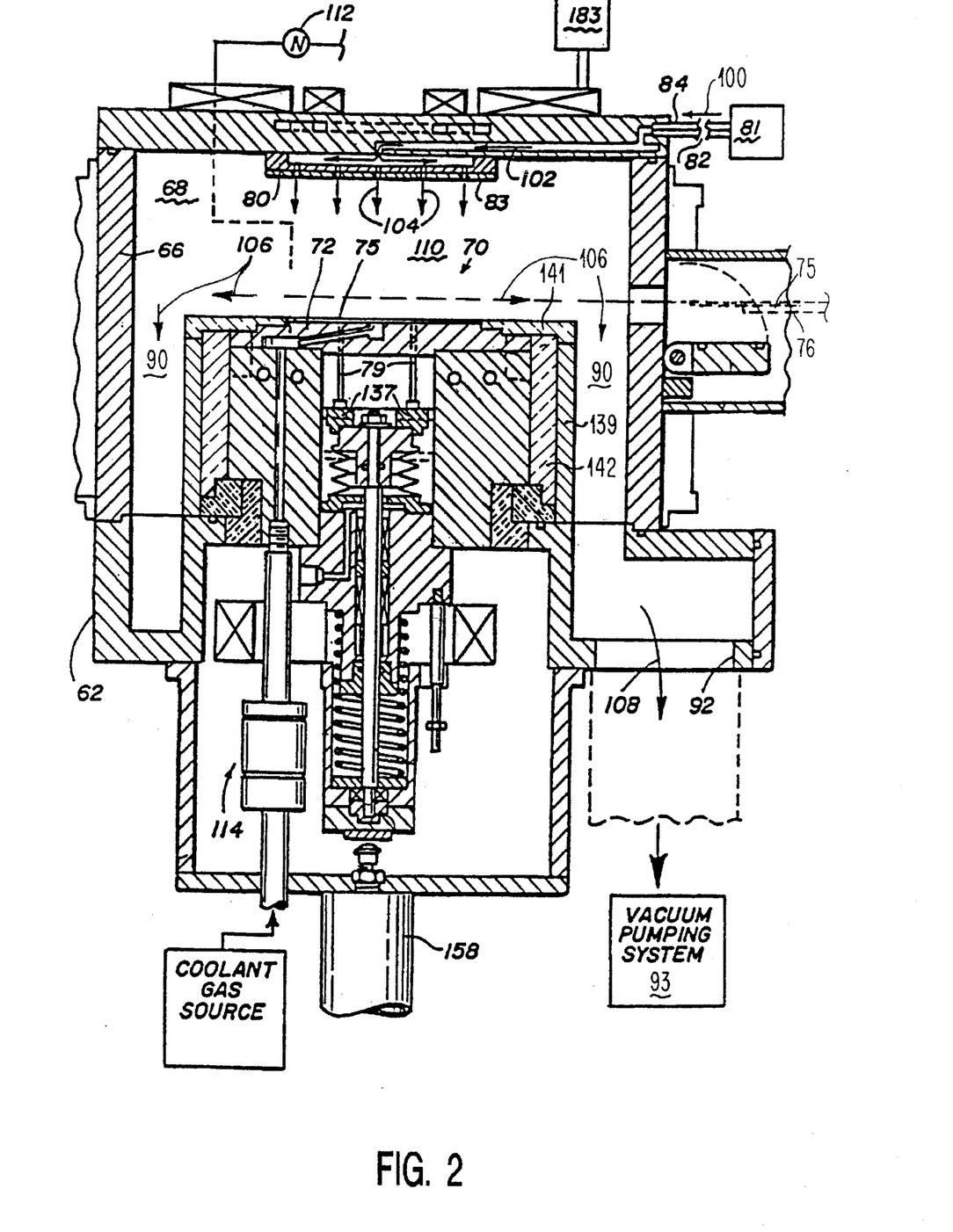
FIG. 2 is a perspective view with cutaways of the plasma reactor of FIG. 1.

FIGS. 1 and 2 depict, respectively, an isometric view of a single wafer, magnetic field enhanced plasma etch reactor 60 which can be used to practice the processes of the present invention, and a vertical cross-section through the reactor 60. The description here is directed primarily to RIE mode plasma etching, but the capability of the depicted reactor extends to simple plasma mode etching as well. The system 60 includes a housing 62, typically of non-magnetic material, such as aluminum, which has an octagonal configuration of outer walls 64. Circular inner wall 66 defines etch chamber 68. The reactor system 60 also includes a pedestal/cathode assembly 72 which is preferably gas and liquid-cooled and a wafer exchange system 74.

The wafer exchange system 74 includes vertically movable lift fingers 79 which pick up a wafer 75 from an externally operated robot blade 76 which is inserted into the chamber, preferably from a load lock external to the chamber. The fingers 79 transfer the wafer to the pedestal/cathode 72 for processing, then return the processed wafer to the robot blade for removal from the chamber. Pedestal/cathode assembly 72 includes an electrostatic chuck 78 seated upon its top surface (not shown in FIGS. 1 and 2) which will be more amply described with reference to FIGS. 3 and 4.

Process gases are supplied to the interior of the chamber 68 by a gas manifold 80 from a gas supply system 81 comprising one or more gas storage reservoir/tanks. The gas supply system 81 communicates to the manifold 80 and chamber 68 via supply line(s) 82, which is coupled into the manifold 80 by inlet connection 84. The system includes an automatic flow control system or other suitable control system which controls the flow rates of the various etchant gases, carrier gases, and the like, supplied to the chamber 68.

The chamber is maintained at a predetermined subatmospheric pressure and spent gases and entrained products are exhausted via annular exhaust chamber 90 communicating to exhaust port 92, which, in turn, is connected to a conventional vacuum pumping system 93. The exhaust flow (shown as 408 in FIG. 4) is directed from the chamber 68 to gas flow channel 90 and to an exhaust handling system which includes vacuum pumping system 93. As will be explained hereinafter, the contaminant particles on an electrostatic chuck will be suspended by the instant plasma sheath cleaning system and entrained in the vacuum exhaust stream described here. This exhaust arrangement facilitates uniform coverage and etching of wafer 75 by the reactant gas. Control of the exhaust system can be by a conventional system, such as a manometer sensor (not shown), which operates through a pressure control system and D.C. motor to control the speed of the blower, or by other conventional control systems.

As indicated by the flow paths and arrows 102, 104, 106, 108 in FIG. 2, the gas communicated by inlet 84 (path 100) is routed into the manifold 80 (arrow 102) and is then directed downwardly from the manifold (arrow 104), forming an etching gas plasma in chamber process region 110 during application of RF power, then flows over the wafer 75 and radially outwardly across the wafer and into the annular exhaust chamber (arrow 106), then out the exhaust port 92 (arrow 108).

The above-mentioned RF power is supplied by an RF supply system 112 to the reactor system 60 for plasma operation, i.e., to create an etching gas plasma from the inlet gases in process region 110. This system 112 includes an RF power supply and a load matching network, and is connected to pedestal/cathode assembly 72, with the chamber walls being at ground. That is, the pedestal is the powered cathode. The RF power typically is supplied at a high frequency, preferably about 13.6 MHz. However, the reactor system 60 can be operated at low frequencies of several KHz.

The use of a powered pedestal/cathode 72 has the advantage of concentrating the RF power and plasma on the surface area of the wafer during processing and increasing the power density across the wafer while reducing it everywhere else. This ensures that etching takes place on the wafer only, reducing erosion in other parts of the chamber, and thus reducing possible wafer contamination. Typically, power densities of about 2.5–3.5 watts/cm$^2$ can be used. These high power densities require cooling. Preferably, the RF powered pedestal/cathode 72 is constructed to combine gas-enhanced wafer-to-cathode thermal conductance and liquid cathode cooling. A control system and power supplies (not shown) are connected to the coils 116, 118, 120 and 122 for independently controlling the direction and magnitude of a D.C. magnetic field applied to the plasma to aid in sustaining and controlling the plasma.

Wafer support pins 79 are mounted on the arm assembly 137 and extend through holes in the upper, wafer support face of the pedestal/cathode assembly 72 which includes the electrostatic chuck 78. Electrostatic chuck 78 is mounted on the top surface of the pedestal/cathode assembly 72, with the assembly further including a surrounding quartz pipe or collar 142, an anodized aluminum ring 139, and an annular quartz cover 141 covering the periphery. The use of wafer support pins 79 moveable through holes (not shown) provided in electrostatic chuck 78 and aligned vertically with the pins, and joint mounting of pins 79 to the common, vertically movable arm assembly 137 provide the capability of wafer exchange with robot blade 76 using a single axis movement.

Further details on the construction and operation of system 60 in FIGS. 1 and 2 are provided in U.S. Pat. No. 4,842,683 to Cheng et al. and the RIE mode plasma etching system of U.S. Pat. No. 4,668,338 to Maydan et al., the entire disclosures of which patents are incorporated by reference herein.

Figure 3:
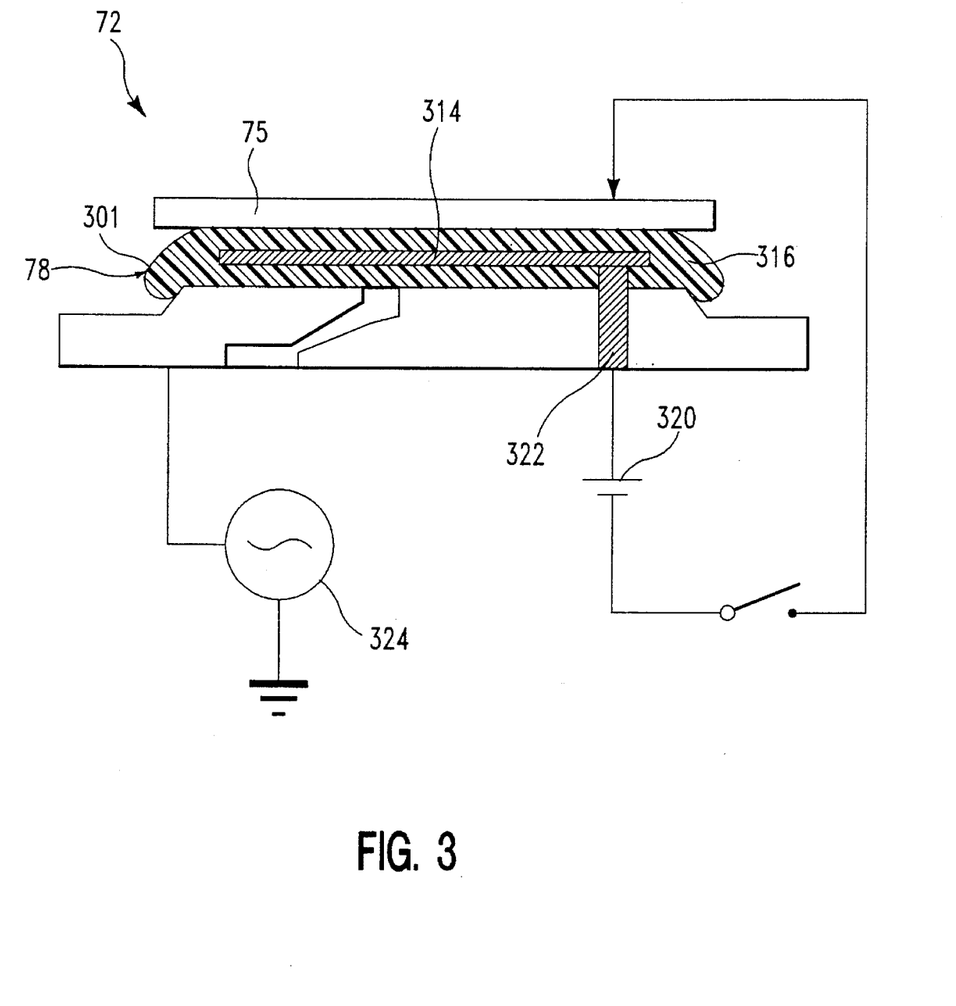
FIG. 3 is a cross-sectional view of an electrostatic chuck used in one embodiment of the instant electrostatic chuck cleaning process.

Turning to FIG. 3, there is illustrated a schematicized detail view of the electrostatic chuck 78 upon the top surface of pedestal/cathode assembly 72. The wafer supporting surface of the chuck 78 are provided with virtual diameters smaller than that of the wafer 75 seated on the chuck surface. As further shown in FIG. 3, the chuck 78 is formed by sealing or sandwiching a conductive element or film 314, such as aluminum or copper, between layers of a hard insulating material 316, such as a ceramic, alumina, diamond or any other hard insulating material known in the art. For example, the hard insulating coating material 316 may include ceramics, such as alumina ($Al_2O_3$), inorganic insulators, such as silicon nitride, and carbon, including diamond. The chuck 78 includes a rim portion 301 curved along the outer circumferential rim section of the wafer supporting surface of the pedestal/cathode 72. As shown in FIG. 3, the conductor element 314 of the electrostatic chuck 78 is connected to a D.C. power source 320 through a conductive wire covered by an insulating cable 322. A high frequency power source 324 is connected to the pedestal/cathode 72.

The chucking system of FIG. 3 is operated in conjunction with the plasma chamber and process described in FIGS. 1 and 2 in the following manner. First a workpiece or substrate in the form of wafer 75 is placed on the upper surface of pedestal/cathode 72 and the interior of the vacuum chamber 68 is evacuated through the vacuum exhaust port 92 by the vacuum pumping system (not shown). At the moment when the plasma is ignited, a direct current voltage is impressed by the D.C. power supply 320 on the chuck 78, whereby the wafer workpiece 312 is electrostatically drawn and held against the upper surface of the pedestal/cathode 72 by way of the Coulombic force generated by the chuck interposed between the wafer and the top pedestal surface. The electrical circuit is completed through the plasma to the ground.

After a process gas such as argon is introduced through manifold 80 into process chamber 68 and when the pressure within the process chamber is at the desired level, high frequency power is applied by power supply 324 to the pedestal/cathode 72 to carry out a plasma etch process on the wafer 75. After processing is completed, the power supplies 320 and 324 are shut off and the wafer removed from the apparatus by operation of the robot blade 76 (FIGS. 1 and 2) in the wafer exchange system of the single wafer apparatus shown in FIGS. 1 and 2.

Figure 4:
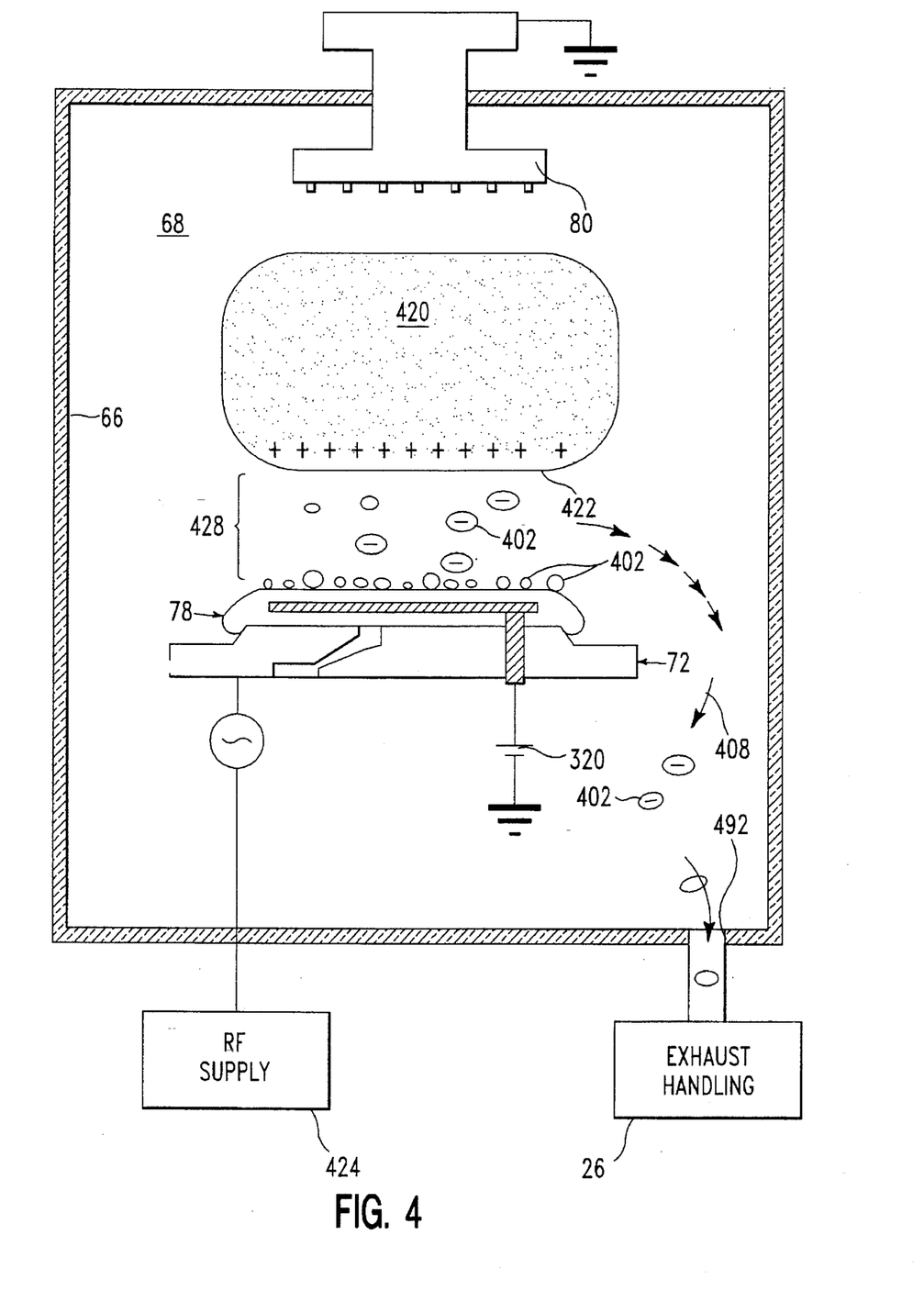
FIG. 4 is a schematic elevational view of a plasma reactor demonstrating the generation of a plasma sheath in accordance with the present contaminant particle control invention.

Turning to FIG. 4, a reduced schematic of the apparatus of FIGS. 1 and 2 and the electrostatic chuck of FIG. 3 is depicted to illustrate the plasma sheath cleaning of an electrostatic chuck in accordance with the present invention. Following an etch process as described above in connection with FIGS. 1, 2, and 3, particulate contaminant particles 402 remain on the surface of electrostatic chuck 78. The particles are largely in a size of less than 3 micron diameter due to the stress placed on these particles by the previously processed and chucked wafers; that is, the Coulombic force generated by the chuck 78 causes each of the wafers in a continuous serial process to press the surface of the chuck in turn, thereby breaking most contaminant particles of greater than 3 microns into smaller particles of less than 3 microns.

A cleaning step for the surface-contaminated chuck 78 is then undertaken by evacuating the chamber 68 through the vacuum exhaust system 26 to a reduced pressure (increased vacuum) of less than or equal to 200 mTorr, supplying a plasma generating gas through the gas distribution manifold 80 at a reduced rate of less than 25 sccm, applying a high frequency of less than 200 Watts, and a magnetic field (B) of less than 50 G. A plasma 420 is generated within chamber 68 by an oscillating electric field E between the anode, which is chamber wall 66 and gas manifold 80, and the pedestal/cathode 72. The oscillations are provided by radio frequency power from an impedence-matched radio frequency power supply 424. This causes an oscillating electric field in the glow region, and causes the creation of a plasma 420 of generally less intensity than employed for treatment of a workpiece with a boundary 422 and a sheath zone 428 oscillating perpendicular to the top surface of chuck 78.

In carrying out the plasma sheath cleaning of electrostatic chuck surfaces herein, magnetic field B is lowered or eliminated so that a peak plasma density is nearer the top of chamber 68 than to sheath 422. By intermittently manipulating and changing the plasma parameters ordinarily used in the processing of a workpiece, it is possible to achieve the generation of a less dense plasma and sheath described above and to suspend contaminant particles seated on the electrostatic chuck pedestal 78 into the plasma sheath 428 where they are entrained in gas exhaust stream 408 and removed through exhaust handling system 26. This is caused by the accumulation of positive plasma generated ions at the plasma boundary 422 proximate to the plasma sheath 428 which accumulated positive charges attract some particles 402 from the electrostatic chuck surface which particles have an induced negative charge from the applied voltage to the pedestal/cathode 72. As preferred plasma cleaning conditions to be adapted intermittently, between substrate processing cycles, for an etch chamber as shown in FIGS. 1 and 2, the magnetic field is set to zero, the RF power supply is lowered to below 200 Watts and the chamber pressure lowered to 100 mTorr, and one of the recipe gases introduced into the chamber 68 whereby a plasma 420 is formed. Contaminant particles 402 are thereby lifted from the chuck 78 and swept out through the vacuum system 26.

In another embodiment of the present invention, a sequential application of voltages of different polarities to an electrostatic chuck is effected during plasma sheath cleaning so as to cause an enhanced suspension of contaminant particles and entrainment of these particles in the vacuum exhaust flow of the gas exhaust flow of the plasma processing system.

In still another embodiment of the present invention, a workpiece comprised of soft material is seated on an electrostatic chuck surface, and a chucking voltage is applied for an interval thereby causing particles, especially those particles of greater than 3 microns, to be imbedded in the soft material workpiece and rendering the chuck surface clean of such relatively large particles. This method can be used alone to clean electrostatic chucks and is particularly effective in removing relatively large particles. This method can also be used concurrently with an ongoing plasma treatment of the seated wafer itself. In this regard, the presence or absence of a plasma will not interfere with the chucking voltage. This embodiment can be employed as a sub-process to the plasma sheath cleaning process described above so as to enhance removal of both small (<3 microns) and large (>3 microns) contaminant particles which accumulate on electrostatic chucks. The plasma sheath cleaning method described herein is normally unsatisfactory in suspending and removing contaminant particles larger than 3 microns in the plasma sheath because of the weight of such large particles. Because of the constant placement (seating) and chucking of workpieces in continuous plasma processes, contaminants that accumulate on electrostatic chucks are constantly being pulverized to reduced sizes during the chucking placement and electrostatic clamping. Consequently, most of the particles on a used chuck will be less than 3 microns. Therefore the plasma sheath process is effective in cleaning electrostatic chucks in plasma processes in which substrates are continuously processed serially. However an optimum plasma sheath cleaning method will include sub-process cleaning steps to remove particles greater than 3 microns from the electrostatic chuck surface, one such sub-process being the soft surface workpiece chucking technique described herein. Other such cleaning subprocesses include vacuum or brush cleaning of the chuck surface by cleaning elements within the chamber. For example, robotic blade 76 (FIGS. 1 and 2) could be outfitted with a small vacuum or brush element which would sweep the chuck with every wafer exchange cycle. If a vacuum element is employed, it would be necessary to vent the chamber in excess of 300 mTorr in order to achieve a pressure differential between the chamber atmosphere and the vacuum cleaning unit for the cleaning unit to be effective.

Within the purview of the plasma sheath cleaning embodiment of the present invention, the plasma conditions are modified within the chamber of FIG. 4 so that the plasma sheath 428 is raised from the chuck surface so as to have the plasma boundary oscillating at an optimal distance from the electrostatic chuck 78 so as to attract and suspend the small contaminant particles in the plasma sheath. This causes the suspended particles to approach the plasma boundary 422 located at a distance from the chuck surface 410 where the attracted contaminant particles are further entrained in the vacuum exhaust flow stream 408 where they are removed by the vacuum exhaust handling system 26. To effect these results, the plasma sheath cleaning conditions, intermittent to an ongoing continuous plasma process, should be selected to effect a peak plasma density furthest away from the chuck 78 than generally exists under general plasma workpiece-processing conditions. This is generally accomplished by reducing the chamber pressure from values as high as 700 mTorr (during plasma processes such as etching) down to pressures of between 100 and 50 mTorr, operating at lower RF power of between 150 to 200 watts, in the presence of a plasma generating gas used in particular process recipes (etching, coating or sputtering) at rates of more than 50 sccm. By using these conditions, the contaminant particles are entrained in the plasma sheath and swept out into the gas flow, which is more intense at distances from the chuck surface.

The plasma process variables subject to control and manipulation in the present plasma sheath cleaning method include (1) the flow rate of the plasma generating gas; (2) the magnitude of the RF power; (3) the plasma chamber pressure; and (4) the magnetic field to achieve a certain plasma density. Manipulation of these parameters during the plasma process generates a plasma sheath which entrains the contaminant particles and causes their expulsion through the vacuum exhaust system as demonstrated in FIG. 4. Typically the system configuration is designed in view of overall plasma processing requirements, and variables (1)–(4) are adjusted within the constraints of any plasma system configuration.

As indicated the instant plasma process of contaminant removal can be conducted during uninterrupted continuous processing of workpieces without the necessity of opening the chamber for cleaning. When employing an etch process for a metallic workpiece where in situ formation of contaminants occurs, control of the plasma etch process conditions and parameters listed above is particularly important in achieving the necessary cleaning characteristics herein described. The pedestal contamination problem becomes even more acute when the workpiece platform is in the form of an electrostatic chuck the Coulombic forces of which tend to draw contaminant particles thereto. Typical etch gases such as $Cl_2$ and $BCl_3$ can be used to create the plasma sheath which is instrumental in the present process. These etchant gases are typically mixed with inert gases such as helium and argon. Other potentially reactive gases such as oxygen and nitrogen can be added to promote formation of the desired plasma sheath for hard electrostatic chucks. In a preferred embodiment, the etch gases should be in a ratio with the other gases in the plasma chamber to effect the plasma density necessary to create the plasma sheath demonstrated in FIG. 3.

Apparatus for carrying out the processes herein is described in previously cited, commonly assigned U.S. Pat. No. 4,842,683, issued Jun. 27, 1989 to Cheng et al. and U.S. Pat No. 4,668,338 issued May 26, 1987 to Maydan et al. Apparatus for carrying out such processes is commercially available from Applied Materials, Santa Clara, Calif., under the designation Precision 5000E and 8300.

EXAMPLES

The following examples demonstrate the plasma sheath formation for the removal of particulate contaminants on the surface of an electrostatic chuck pedestal surface in a plasma chamber employed for plasma etching.

EXAMPLE 1

In actual practice of the present process of particulate contaminant removal from plasma reaction chamber pedestal, there is provided a workpiece comprised of a solid wafer of photoresist comprised of a phenol formaldehyde novalak resin with a diazoquinone sensitizer. A single wafer plasma apparatus similar to that demonstrated in FIGS. 1 and 2 is employed. A glow discharge plasma environment is created utilizing $BCl_3$, $Cl_2$, and $N_2$ gases each flowing at approximately 50 sccm. The power applied ranges between 500 to 800 W, the process chamber pressure ranges from about 200 to 600 mT, and the operational workpiece temperature is about 80° C., and the chamber wall temperature is maintained at 65 degrees Centigrade. The power is applied for three minutes and thereafter the wafer is removed by a robot blade similar to that shown as element 75 in FIGS. 1 and 2. There is observed a coating of contaminant particles throughout the chamber including on the alumina covered electrostatic chuck pedestal. Thereafter a plasma cleaning step is carried out with no wafer present by flowing Ar gas into the chamber at 50 sccm, lowering the power to 200 W, and lowering the pressure to 100 mTorr thereby generating a less dense plasma (less dense than that of the treatment plasma) which was continued for ten seconds. Upon cessation of the power and termination of the plasma the electrostatic chuck is observed to be free of contaminant particles.

EXAMPLES 2, 3, 4, AND 5

Examples 2, 3, 4, and 5 demonstrate the use of the instant electrostatic chuck plasma cleaning process in RIE processes employing the Precision 5000E apparatus referred to above.

The reactor system 60 demonstrated in FIGS. 1 and 2 employing an anodized $Al_2O_3$ electrostatic chuck is used to etch submicron silicon films. The reaction gases used were as follows:

2. HBr, $Cl_2$, and $H_2O_2$;
3. HBr, $SF_4$, and $H_2O_2$;
4. HBr, $NF_3$, and $H_2O_2$;
5. HBr and $SF_6$.

While supplying the reaction gas recipes in each of the examples, evacuation through the high vacuum exhaust port 92 (FIG. 2) is continued such that the plasma treatment chamber 68 is maintained at about 100 mTorr. The reaction gas is introduced at a flow rate of about 150 sccm and the power applied is about 600 Watts for 8 inch wafers. The magnetic field is maintained at more than 50 G. At the end of etching in each example, vertical profiles are evidenced in the wafer.

In each example, when the etch plasma is terminated and the etched wafer is lifted from the electrostatic chuck pedestal 78, the vacuum in the chamber is increased to 50 mTorr, HBr gas is introduced at about 120 sccm, and a less dense plasma (than that of the treatment plasma) created and applied at a power of 100 Watts and a magnetic field of 10 G for a period of 10 seconds. The less dense plasma effectively removes residual particles from the electrostatic chuck surface prior to introduction of the next wafer to be processed in the 5000E continuous reactor system 60 illustrated in FIGS. 1 and 2.

Having described the invention, it will be apparent to those skilled in the art that various modifications can be made within the scope of the present invention. For example, the process configuration of FIGS. 1 and 2 is exemplary and other plasma devices and chambers can be used.

We claim:

1. A method for cleaning an electrostatic chuck having a surface for retaining a substrate at a processing station within a plasma processing chamber provided with a vacuum exhaust capability and adapted for serially processing substrates within a controlled subatmospheric environment, comprising:

a) retaining a substrate at the substrate retaining surface of the electrostatic chuck within a plasma processing chamber;

b) communicating into the chamber at least one selected gas;

c) applying electrical energy to the chamber to establish a gas plasma and an associated electric field substantially perpendicular to the substrate-retaining surface of the electrostatic chuck so as to perform a plasma process on the substrate;

d) removing the processed substrate from the electrostatic chuck surface upon completion of the plasma processing; and e) performing an in-situ electrical or mechanical removal of contaminant particles from the top of the electrostatic chuck surface in the closed chamber prior to introduction of the next substrate to be plasma processed, while maintaining the chamber under a controlled subatmospheric environment without opening the chamber to the atmosphere.

2. The method of claim 1 wherein the electrostatic chuck is comprised of a hard surface material.

3. The method of claim 1 wherein the contaminant particle removal is effected by creating a cleaning plasma above the substrate retaining surface after removal of a processed substrate, whereby particulate contaminant residues formed on said surface are suspended in the plasma sheath and entrained in the gas flow stream, causing the particles to be drawn from the chamber through the vacuum exhaust.

4. The method of claim 3, wherein the density of the plasma is lower than the plasma during the plasma treatment of the substrate.

5. The method of claim 4, wherein the electrical energy is r.f. electrical energy.

6. The method of claim 1, in which the plasma is sustained by both said electric field and a magnetic field during substrate processing, and in which the plasma is decreased in density and the intensity of the magnetic field is reduced during the removal of contaminant particles step.

7. The method of claim 6, in which the magnetic field is eliminated during the removal of contaminant particles step.

8. The method of claim 6, in which the pressure within the processing chamber during the removal of contaminant step is lowered below that which is used during the plasma treatment of a substrate.

9. The method of claim 1, in which the plasma is sustained by both said electric field and a magnetic field during substrate processing, and in which the magnetic field is reduced during the removal of contaminant particles step so as to move the peak plasma density away from the electrostatic chuck.

10. The method of claim 9, in which the plasma is decreased in density during the removal of contaminant particles step.

11. The method of claim 10, in which during the contaminant particles removal, the pressure within the processing chamber is lowered below that used during plasma treatment of a substrate.

12. The method of claim 4, wherein a cleaning plasma is created by providing a plasma generating gas at a rate of more than 25 sccm, a magnetic field of less than 50 G, a pressure of less than 200 mTorr, and electrical energy of less than 200 W.

13. The method of claim 1, wherein at least one of the gases used in the plasma processing of a substrate is also used during the removal of contaminant particles.

14. The method of claim 1, wherein the contaminant particle removal step includes:

f) placing a workpiece comprised of a soft resin material surface onto the electrostatic chuck surface in a manner whereby the soft resin material is in contact with the chuck surface;

g) applying a direct current chucking voltage the chuck to cause the soft resin material to be drawn and pressed to the surface of the chuck whereby contaminant particles are embedded in the soft resin material; and h) removing the contaminant containing workpiece from the chamber.

15. A method for continuously conducting plasma treatment of semiconductor substrates in a closed vacuum chamber, comprising:

a) providing a plasma chamber including a gas exhaust capability and a substrate pedestal having an electrostatic chuck clamp adapted to retain a substrate on the surface of the chuck;

b) communicating into the chamber one or more selected plasma generating gases;

c) applying electrical energy to the chamber to establish a treatment plasma and an associated electric field substantially perpendicular to the pedestal surface for receiving the substrate so as to perform a treatment of said substrate;

d) removing the processed substrate from the electrostatic chuck surface upon completion of the plasma treatment; and e) creating a plasma above the electrostatic chuck pedestal surface of a lower density than said treatment plasma when the electrostatic chuck surface is exposed, whereby particulate contaminant residues formed on said pedestal are suspended in the plasma sheath and entrained in the gas removal stream of the chamber causing the particles to be drawn from the chamber during gas exhaust prior to introduction of the next substrate to be plasma processed.

16. The method of claim 15 further comprising the additional step of:

f) sequentially applying a voltage of reverse polarity to the electrostatic chuck during the plasma sheath cleaning step to enhance transfer and suspension of the contaminant particles to the plasma sheath.

17. The method of claim 15 further comprising the step of:

f) venting the vacuum chamber to a pressure of greater than 300 mTorr; and g) applying a vacuum to clean the electrostatic chuck surface.

18. The method of claim 15 further comprising the step of employing a magnetic field to aid in sustaining the plasma during treatment of the workpiece, and reducing or eliminating the magnetic field with the establishment of the plasma of reduced density.

19. The method of claim 15 wherein a lower density plasma is created by providing a plasma generating gas at a rate of more than 25 sccm, a magnetic field of less than 50 G, a pressure of less than 200 mTorr, and electrical energy of less than 200 W.

20. The method of claim 15 wherein the plasma treatment process is plasma enhanced chemical vapor deposition.

21. The method of claim 15 wherein the plasma treatment process is plasma etch.

22. The method of claim 15 additionally comprising the steps of:

f) introducing a workpiece comprised of a soft resin material surface onto the electrostatic chuck surface in a manner whereby the soft resin material is in contact with the chuck surface;

g) applying a direct current chucking voltage the chuck to cause the soft resin material to be drawn and pressed to the surface of the chuck whereby contaminant particles are embedded in the soft resin material; and h) removing the contaminant containing workpiece from the chamber.

23. A method of removing contaminant particles from a hard surface electrostatic chuck comprising the steps of:

a) providing a plasma chamber comprised of an electrostatic chuck substrate pedestal;

b) placing a workpiece comprised of a soft resin material surface onto the electrostatic chuck surface in a manner whereby the soft resin material is in contact with the chuck surface;

c) applying a direct current chucking voltage to the chuck to cause the soft resin material to be drawn and pressed to the surface of the chuck whereby relatively large contaminant particles are embedded in the soft resin material; and d) removing the contaminant containing soft resin containing workpiece from the chamber.

24. The method of claim 23 additionally comprising the step of plasma treating the workpiece before removal.

* * * * *